United States Patent
Endo

(10) Patent No.: US 9,954,459 B2
(45) Date of Patent: Apr. 24, 2018

(54) INVERTER DEVICE

(71) Applicant: MEIDENSHA CORPORATION, Tokyo (JP)

(72) Inventor: Takato Endo, Mishima (JP)

(73) Assignee: MEIDENSHA CORPORATION, Tokyo (JP)

(*) Notice: Subject to any disclaimer, the term of this patent is extended or adjusted under 35 U.S.C. 154(b) by 0 days.

(21) Appl. No.: 15/552,935

(22) PCT Filed: Feb. 15, 2016

(86) PCT No.: PCT/JP2016/054273
§ 371 (c)(1),
(2) Date: Aug. 23, 2017

(87) PCT Pub. No.: WO2016/136516
PCT Pub. Date: Sep. 1, 2016

(65) Prior Publication Data
US 2018/0054137 A1 Feb. 22, 2018

(30) Foreign Application Priority Data

Feb. 15, 2016 (JP) .................................. 2015-033457

(51) Int. Cl.
*H02M 7/00* (2006.01)
*H05K 7/20* (2006.01)
*H05K 7/14* (2006.01)

(52) U.S. Cl.
CPC .......... *H02M 7/003* (2013.01); *H05K 7/1432* (2013.01); *H05K 7/209* (2013.01)

(58) Field of Classification Search
CPC .......... H02M 7/003; H02M 7/42; H02M 7/44; H02M 2007/42; H02M 2007/44;
(Continued)

(56) References Cited

U.S. PATENT DOCUMENTS 5,623,399 A  4/1997 Ishii et al.
5,648,892 A  7/1997 Wieloch et al.
(Continued)

FOREIGN PATENT DOCUMENTS

EP   766504 A2   4/1997
JP   7-298641 A   11/1995
(Continued)

OTHER PUBLICATIONS

Japanese Decision of Patent and English translation, dated Aug. 23, 2016, 5 pages.

*Primary Examiner* — Matthew Nguyen
(74) *Attorney, Agent, or Firm* — Foley & Lardner LLP

(57) ABSTRACT

Between smoothing capacitor connected between connection conductors for positive and negative poles and semiconductor power modules constituting inverter, a circuit inductance might be increased due to imbalance of current circuit loops. Phase arms each formed by a series combination of semiconductor power modules are stacked, and the group of semiconductor power modifies connected with positive connection conductor and the group of the semiconductor power modules connected with negative connection conductor are arranged in the same direction. There is formed an interspace between the arrangement of semiconductor power modules for positive pole and the arrangement of semiconductor power modules for negative pole. Connection conductors for positive and negative poles extend in a parallel state with an insulator interposed between connection conductors, through the interspace. The connection conductors are bent in a region near connection terminals of the semiconductor power modules and connected with the semiconductor power modules.

3 Claims, 4 Drawing Sheets

(58) Field of Classification Search
CPC ....... H01L 23/31; H01L 23/34; H01L 23/345; H01L 25/43; H01L 25/074; H05K 7/209; H05K 7/1432
See application file for complete search history.

(56) References Cited

U.S. PATENT DOCUMENTS

| | | | |
|---|---|---|---|
| 5,793,106 A * | 8/1998 | Yasukawa | H01L 23/3121 257/706 |
| 5,835,354 A | 11/1998 | Bug et al. | |
| 5,835,362 A | 11/1998 | Keller et al. | |
| 6,219,266 B1 * | 4/2001 | Pfauser | H02M 7/003 361/709 |
| 6,618,278 B2 * | 9/2003 | Suzuki | H02M 7/003 361/679.02 |
| 6,870,737 B2 * | 3/2005 | Hashimoto | H02M 7/003 361/709 |
| 2011/0261600 A1 | 10/2011 | Tachibana | |
| 2013/0020694 A1 * | 1/2013 | Liang | H01L 25/072 257/691 |

FOREIGN PATENT DOCUMENTS

| | | |
|---|---|---|
| JP | 8-510112 A | 10/1996 |
| JP | 9-308267 A | 11/1997 |
| JP | 2002-44949 A | 2/2002 |
| JP | 2004-56984 A | 2/2004 |
| JP | 2006-262623 A | 9/2006 |
| JP | 2011-172469 A | 9/2011 |
| JP | 2013-42663 A | 2/2013 |
| JP | 2014-54103 A | 3/2014 |

* cited by examiner

INVERTER DEVICE

TECHNICAL FIELD

The present invention relates to inverter apparatus or device, and more specifically to an arrangement of parts of the inverter apparatus for reducing a circuit inductance.

BACKGROUND ART

In the case of single phase inverter, for example, an inverter apparatus includes, as main components, a plurality of semiconductor modules (IGBTs in the following example) IGBT1~IGBT4 for respective phases, a smoothing capacitor C, connection conductors P and N for a dc circuit and output conductors (output terminals) U and V, as shown in FIG. 3. The components of this inverter apparatus are generally arranged or assembled as shown in FIG. 4.

In the arrangement of FIG. 4, the modules IGBT1 and IGBT2 connected in series to form a U phase arm are arranged or aligned in a direction which is a front and rear direction (up and down direction as viewed in a plan view) so that the modules IGBT1 and IGBT2 confront each other. The modules IGBT3 and IGBT4 connected in series to form a V phase arm are arranged or aligned so that the modules IGBT3 and IGBT4 confront each other, and the series combination of IGBT3 and IGBT4 is disposed in parallel with the series combination of IGBT1 and IGBT2 at a position adjacent to the series combination of IGBT1 and IGBT2. Each of the series combinations is connected with the positive and negative connection conductors P and N for the positive pole and negative pole. Each of the connection conductors P and N is taken out in a left direction in the figure and bent in a perpendicular direction. Each of the output conductors U and V is taken out in a right direction in the figure.

The smoothing capacitor or capacitors C is disposed between the IGBTs and the bent portions of connection conductors P and N. A component In is an insulator and a component H is a heat sink.

Inverter apparatus arranged to reduce the circuit inductance are shown in Patent Documents 1 and 2.

Patent Document 1: JP 2013-42663A
Patent Document 2: JP 2006-262623A

SUMMARY OF THE INVENTION

The arrangement of the components as shown in FIG. 4 encounters a problem of increased circuit inductance specifically near the connection terminals of the IGBTs, for the following two reasons.

(1) The conduction path of current is bent and hence the loop of current is enlarged, resulting in an increase of the circuit inductance.

(2) The parallel arrangement of conductors of opposite current directions functions to cancel out circuit inductances as is well known. However, in practice, it is difficult to dispose the connection conductors in the parallel state in which the connection conductors extend alongside each other, because of branches of the connection conductors.

In the construction of FIG. 4, the distances from the smoothing capacitor C fixed to the connection conductor P by fastening devices 1 and 2 such as screw fasteners to the module IGBT1 and IGBT3 fixed to the connection conductors P by fastening devices 3 and 4, for example, are not equal to each other. That is, the distance from the smoothing capacitor C to the fastening device 4 or to the module IGBT3 is longer than the distance from the smoothing capacitor C to the module IGBT1. Therefore, in the switching operation, the loop of current flowing through the capacitor C and the modules IGBT1 and IGBT2 is unbalanced with the loop of current flowing through the capacitor C and the modules IGBT3 and IGBT4, and this imbalance could cause increase of the circuit inductance.

Specifically in a high frequency inverter apparatus, it is important or essential to reduce the inductance of the dc circuit and moreover to reduce the circuit inductance with a smaller circuit loop reducing the inductance from the output of IGBTs to the load, and a parallel arrangement of conductors of opposite current directions.

Therefore, it is an object of the present invention to provide inverter apparatus for reducing the circuit inductance.

According to one aspect of the present invention, an inverter apparatus comprising, as main components: a plurality of semiconductor power modules for phases, and equipped with heat sink(s); positive and negative connection conductors, respectively, for positive and negative poles of a dc circuit; smoothing capacitor(s); and output conductors, respectively, for the phases;

wherein the group of the semiconductor power modules connected with the positive connection conductor for the positive pole and the group of the semiconductor power modules connected with the negative connection conductor for the negative pole are arranged or aligned in the same direction, with an interspace or interval formed between an arrangement for the positive pole and an arrangement for the negative pole, in a stack state in which phase arms each of which is a series combination of the semiconductor power modules provided for one of the phases are stacked;

the connection conductors for the positive and negative poles extend in a parallel state extending along each other, with an insulator interposed between the connection conductors, through the interspace, into a region near connection terminals of the semiconductor power modules;

the smoothing capacitor is attached to a portion in which the connection conductors extend along each other with the insulator therebetween; and the output conductors from the semiconductor power modules are taken out in a parallel state extending along each other with an insulator between any two of the phases.

According to one aspect of the present invention, an inverter apparatus comprises: a plurality of semiconductor power modules arranged to form phase arms each of which includes a set of the semiconductor power modules connected in series between a positive pole and a negative pole of a dc circuit, for one of phases;

a heat sink section attached to the semiconductor power modules;

positive and negative connection conductors arranged to serve, respectively, as the positive pole and the negative pole of the dc circuit, each of the phase arms for one of the phases being connected between the positive and negative connection conductors;

at least one smoothing capacitor connected between the positive and negative connection conductors; and output conductors each of which is connected with ac output terminals of the semiconductor power modules of one of the phase arms;

wherein the semiconductor power modules of the phase arms are arranged so that the semiconductor power modules connected with the positive connection conductor are stacked, the semiconductor power modules connected with the negative connection conductor are stacked, and there is formed an interspace between a positive side heat sink which is included in the heat sink section and attached to the semiconductor power modules connected with the positive connection conductor for the positive pole and a negative side heat sink which is included in the heat sink section and attached to the semiconductor power modules connected with the negative connection conductor for the negative pole;

the positive and negative connection conductors for the positive and negative poles of the dc circuit are extended along each other with an insulator interposed or sandwiched between the positive and negative connection conductors, through the interspace between three heat sinks;

the positive connection conductor includes a first end fixed to a connection terminal of each of the semiconductor power modules for the positive pole, and a second end taken out through the interspace between the positive side and negative side heat sinks, and the negative connection conductor includes a first end fixed to a connection terminal of each of the semiconductor power modules for the negative pole, and a second end taken out through the interspace between the positive side and negative side heat sinks;

the smoothing capacitor or capacitors is attached to the connection conductors taken out from the interspace; and each of the output conductors is connected with the ac output terminal of the semiconductor power modules of a corresponding one of the phase arms, in a region near the connection terminals of the semiconductor power modules, in a state in which portions of the output conductors extend along each other in a direction substantially perpendicular to a direction in which portions of the connection conductors extend.

According to the present invention, each of the connection conductors for the positive and negative poles is a plate-shaped conductor including a portion bent to form an angle substantially equal to 90 degrees, in the region near the connection terminals of the semiconductor power modules.

BEST MODE(S) FOR CARRYING OUT THE INVENTION

Figure 1:
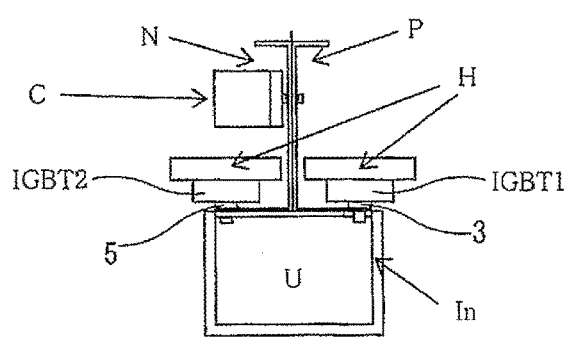
FIG. 1 is a view for showing the construction of an inverter apparatus according to an embodiment of the present invention in left and right side views, a front view placed between the left and right side views, and a plan view placed above the front view.
Figure 1:
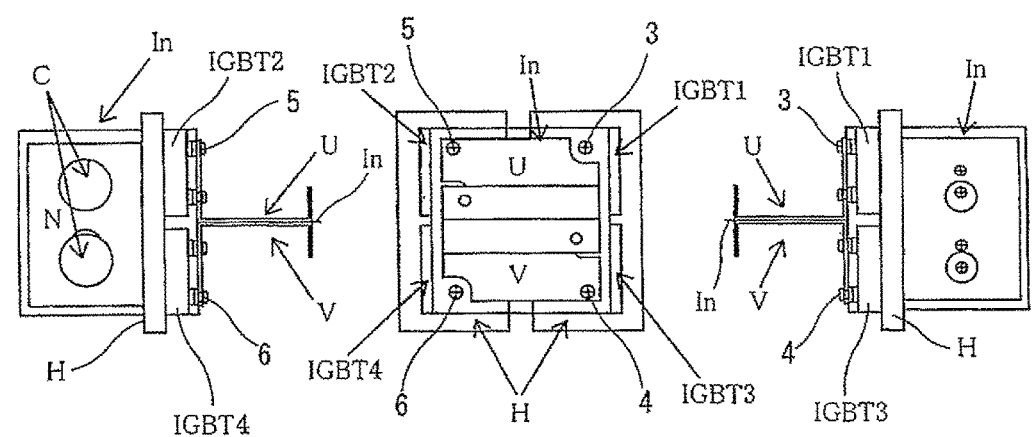
Figure 3:
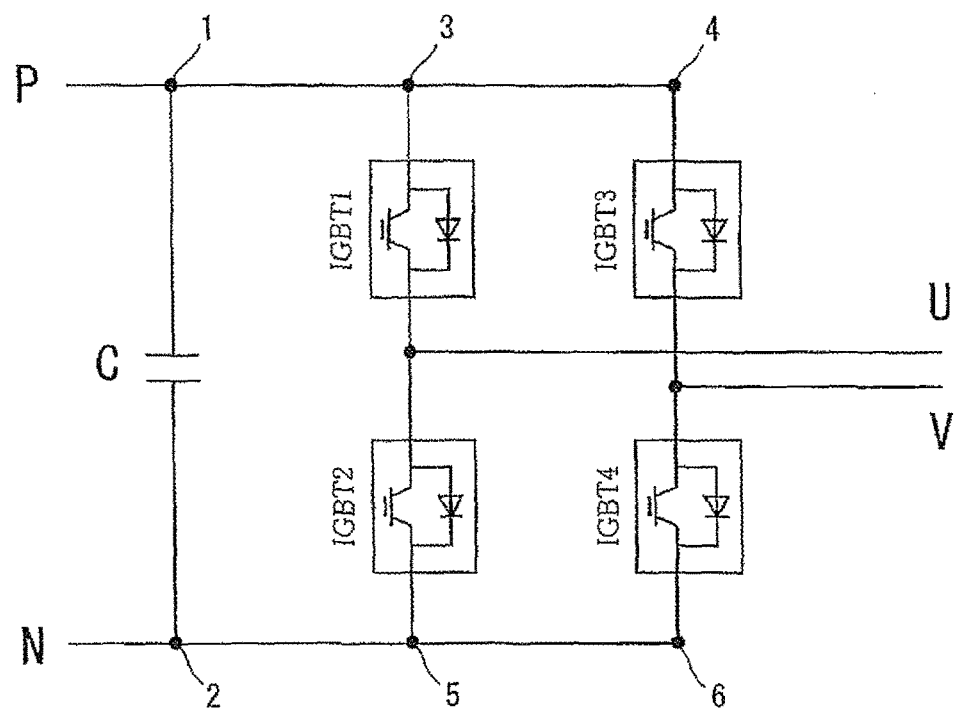
FIG. 3 is a circuit diagram of a single-phase inverter.
Figure 4:
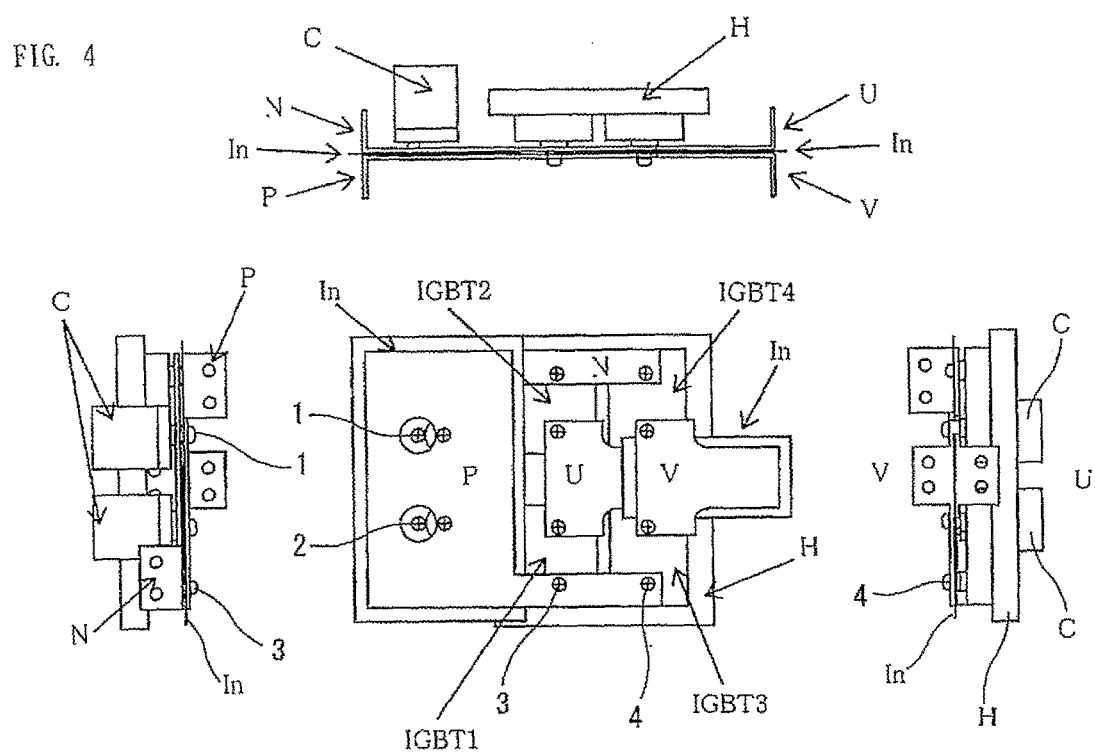
FIG. 4 is a view showing the construction of a single-phase inverter apparatus of an earlier technology in left and right side views, a front view placed between the left and right side views, and a plan view placed above the front view.

FIG. 1 is a construction view showing the arrangement of component parts according to the present invention. FIG. 1 shows an example of a single-phase inverter apparatus. The U-phase arm and V-phase arm are arranged or arrayed in an overlaid or stacked state as shown in a front view. The semiconductor power modules IGBTs connected in series in each phase are equipped with heat sinks H and arranged in a direction of depth in the figure. The semiconductor power modules IGBT1 and IGBT3 (of FIG. 3) connected with the positive connection conductor P of the positive pole and the semiconductor power modules IGBT2 and IGBT4 connected with the negative connection conductor N of the negative pole are disposed on the right side and the left side, respectively, with an interspace separating the arrangement of the positive pole and the arrangement of the negative pole from each other, as shown in a plan view. At a central portion of the interspace between the arrangement of the positive pole and the arrangement of the negative pole, the connection conductors P and N are extended along each other or in parallel to each other, with an insulator In interposed or sandwiched between the connection conductors P and N. A plurality of smoothing capacitors C are disposed on one side or both sides of the extended connection conductors P and N. The positive and negative terminals of the smoothing capacitors C are connected, respectively, with the connection conductors P and N. When the number of smoothing capacitors C is large and the smoothing capacitors C are disposed on both sides of the connection conductors P and N, the smoothing capacitors C are disposed zigzag or staggered on the left side and the right side to avoid interference in the attachment or assemblage of the smoothing capacitors C.

Each of connection conductors P and N is a plate-shaped member and the insulator In of a plate shape is sandwiched or interposed between the plate-shaped connection conductors P and N. In this parallel state with the insulator In sandwiched therebetween, the connection conductors P and N extend side by side to a region near the connection terminals of the semiconductor power modules IGBTs. In this region, the positive and negative connection conductors P and N are bent, respectively, in the right and left directions substantially at right angles and connected, respectively, with the positive and negative terminals of the semiconductor power modules IGBT.

Similarly, the U-phase and V-phase output conductors U and V with an insulator In sandwiched or interposed between the output conductors U and V are extended toward the IGBTs from this side in the front view and separated left and right in a region near the connection terminals of IGBTs. In the region near the connection terminals of IGBTs, the U-phase and V-phase output conductors U and V are connected with the terminals of the IGBTs on the ac output side, respectively, in the state in which a portion of the U-phase output conductor U and a portion of the V-phase output conductor V extend along each other in the direction perpendicular or orthogonal to the direction in which a portion of the connection conductor P and a portion of the connection conductor N extend along each other. In this state, the smoothing capacitor(s) C is disposed behind the heat sinks H, so that the smoothing capacitor C does not impede an operation such as a tightening operation of screw fasteners at the connection terminals of IGBTs.

Figure 2:
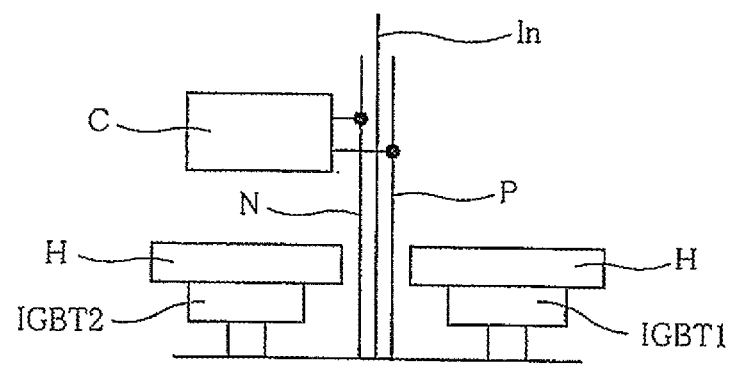
FIG. 2 is a view schematically showing a three-phase inverter apparatus according to the present invention.
Figure 2:
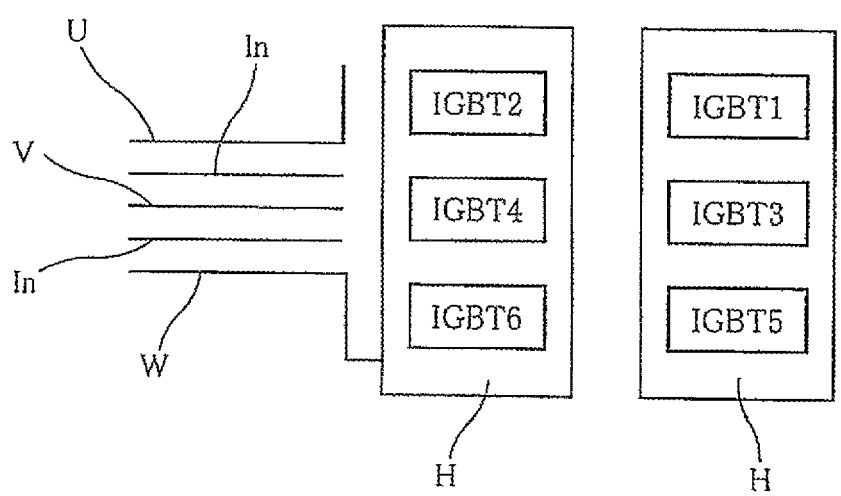

Although the inverter apparatus is a single-phase inverter apparatus in the above-mentioned practical example, components can be arranged in the same manner in the case of a three-phase inverter apparatus, too. FIG. 2 schematically shows the three-phase inverter apparatus. The semiconductor power modules IGBT1, IGBT3 and IGBT5 connected with the connection conductor P are disposed on the right side as viewed in the figure, and the semiconductor power modules IGBT2, IGBT4 and IGBT6 connected with the connection conductor N are disposed on the left side. In the case of the three-phase inverter, the reactance from inverter output to the load becomes slightly greater in the U and W phases as compared to the V phase in comparison to the single-phase inverter. However, it is possible to decrease the circuit inductance sufficiently as compared to the conventional arrangement.

As explained above, according to the present invention, the group of IGBTs connected with the positive side connection conductor P and the group of IGBTs connected with the negative side connection conductor N are arranged or aligned along the connection conductors P and N, at the positions equidistant from the position of the connection conductors. With this arrangement, it is possible to reduce the circuit inductance by decreasing the loop of current flowing through the smoothing capacitor C and IGBT1 and IGBT2 at the time of switching operation and the loop of current flowing through the smoothing capacitor C and IGBT3 and IGBT4 at the time of switching operation and keeping a proper balance between the currents of both loops to cancel out the circuit inductances.

The invention claimed is:

1. An inverter apparatus comprising:
    a plurality of semiconductor power modules arranged to form phase arms each of which includes a set of the semiconductor power modules connected in series between a positive pole and a negative pole of a dc circuit, for one of phases;
    a heat sink section attached to the semiconductor power modules;
    positive and negative connection conductors arranged to serve, respectively, as the positive pole and the negative pole of the dc circuit, each of the phase arms for one of the phases being connected between the positive and negative connection conductors;
    a smoothing capacitor connected between the positive and negative connection conductors; and
    output conductors each of which is connected with ac output terminals of the semiconductor power modules of one of the phase arms;
    wherein the semiconductor power modules of the phase arms are arranged so that the semiconductor power modules connected with the positive connection conductor are stacked, the semiconductor power modules connected with the negative connection conductor are stacked, and there is formed an interspace between a heat sink which is included in the heat sink section and attached to the semiconductor power modules connected with the positive connection conductor for the positive pole and a heat sink which is included in the heat sink section and attached to the semiconductor power modules connected with the negative connection conductor for the negative pole;
    the positive and negative connection conductors for the positive and negative poles of the dc circuit are extended along each other with an insulator interposed between the positive and negative connection conductors, through the interspace between three heat sinks;
    the positive connection conductor includes a first end fixed to a connection terminal of each of the semiconductor power modules for the positive pole, and a second end taken out through the interspace between the heat sinks, and the negative connection conductor includes a first end fixed to a connection terminal of each of the semiconductor power modules for the negative pole, and a second end taken out through the interspace between the heat sinks;
    the smoothing capacitor is attached to the connection conductors taken out from the interspace; and
    each of the output conductors is connected with the ac output terminal of the semiconductor power modules of a corresponding one of the phase arms, in a region near the connection terminals of the semiconductor power modules, in a state in which portions of the output conductors extend along each other in a direction substantially perpendicular to a direction in which portions of the connection conductors extend.

2. The inverter apparatus as claimed in claim 1, wherein a plurality of the smoothing capacitors are disposed zigzag on the connection conductors for the positive and negative poles.

3. The inverter apparatus as claimed in claim 1, wherein each of the connection conductors for the positive and negative poles is a plate-shaped conductor including a portion bent to form an angle substantially equal to 90 degrees in the region near the connection terminals of the semiconductor power modules.

* * * * *

UNITED STATES PATENT AND TRADEMARK OFFICE
CERTIFICATE OF CORRECTION

| | |
|---|---|
| PATENT NO. | : 9,954,459 B2 |
| APPLICATION NO. | : 15/552935 |
| DATED | : April 24, 2018 |
| INVENTOR(S) | : Takato Endo |

It is certified that error appears in the above-identified patent and that said Letters Patent is hereby corrected as shown below:

On the Title Page

Item (30) should read:
(30)     Foreign Application Priority Data
Feb. 24, 2015 (JP)............................2015-033457

Signed and Sealed this
Twenty-sixth Day of June, 2018

Andrei Iancu
*Director of the United States Patent and Trademark Office*